(12) United States Patent
Yuan et al.

(10) Patent No.: US 10,839,886 B2
(45) Date of Patent: Nov. 17, 2020

(54) METHOD AND APPARATUS FOR ADAPTIVE DATA RETENTION MANAGEMENT IN NON-VOLATILE MEMORY

(71) Applicant: Western Digital Technologies, Inc., San Jose, CA (US)

(72) Inventors: Jingfeng Yuan, Livermore, CA (US); Jeffrey Lee Whaley, San Jose, CA (US); Xiaoheng Chen, Dublin, CA (US); Wei Wang, Dublin, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 69 days.

(21) Appl. No.: 16/035,521

(22) Filed: Jul. 13, 2018

(65) Prior Publication Data
US 2019/0378565 A1    Dec. 12, 2019

Related U.S. Application Data (60) Provisional application No. 62/683,458, filed on Jun. 11, 2018.

(51) Int. Cl.
*G11C 11/40* (2006.01)
*G11C 11/406* (2006.01)
*G11C 16/34* (2006.01)

(52) U.S. Cl.
CPC ...... *G11C 11/40626* (2013.01); *G11C 16/349* (2013.01); *G11C 16/3418* (2013.01); *G11C 2211/406* (2013.01)

(58) Field of Classification Search
CPC ............ G11C 11/40626; G11C 16/349; G11C 16/3418; G11C 2211/406
See application file for complete search history.

(56) References Cited

U.S. PATENT DOCUMENTS 7,233,538 B1 * 6/2007 Wu ..................... G11C 11/406
                                                     365/222
8,966,343 B2    2/2015 Syu et al.
(Continued)

FOREIGN PATENT DOCUMENTS

CN          106910528 A      6/2017

OTHER PUBLICATIONS

Lu et al, "Adaptive block-based refresh techniques for mitigation of data retention faults and reduction of refresh power"; 2017 International Test Conference in Asia (ITC-Asia); Sep. 2017; http://ieeexplore.ieee.org/document/8097121/; DOI: 10.1109/ITC-ASIA.2017.8097121; 3 pages.
(Continued)

*Primary Examiner* — Mohammed A Bashar
(74) *Attorney, Agent, or Firm* — Loza & Loza, LLP; Gabriel Fitch (57) ABSTRACT

Aspects of the disclosure provide systems and methods for adaptive data retention management in non-volatile memory. A solid state device (SSD) includes non-volatile memory (NVM) for storing data. The SSD is configured to determine a temperature of the NVM. If the temperature of the NVM is below a predetermined temperature, the SSD maintains a data retention refresh rate of the data stored in the NVM. If the temperature of the NVM is equal to or above the predetermined temperature, the SSD adjusts the data retention refresh rate at a first rate and then a second rate, each adjustment based on the temperature of the NVM. The first rate and the second rate are different, for example, the second rate is less than the first rate.

23 Claims, 9 Drawing Sheets

(56) References Cited

U.S. PATENT DOCUMENTS

| | | |
|---|---|---|
| 9,165,668 B1 | 10/2015 | Zhao et al. |
| 9,520,200 B2 | 12/2016 | Nurminen et al. |
| 9,668,337 B2 | 5/2017 | Stoev et al. |
| 2009/0283736 A1* | 11/2009 | Kanzawa ............ G11C 13/0007 257/2 |
| 2012/0151260 A1 | 6/2012 | Zimmermann et al. |
| 2014/0325165 A1 | 10/2014 | Kobayashi et al. |
| 2016/0125921 A1* | 5/2016 | Kambegawa ......... G11C 11/406 711/106 |
| 2016/0364175 A1 | 12/2016 | Yang et al. |

OTHER PUBLICATIONS

Cai et al, "Data Retention in MLC NAND Flash Memory: Characterization, Optimization, and Recovery"; Proceedings of the IEEE Symposium on High Performance Computer Architecture; Feb. 2015; http://repository.cmu.edu/cgi/viewcontent.cgi?article=1354&context=ece; 14 pages.

Seif et al, "Refresh frequency reduction of data stored in SSDs based on A-timer and timestamps"; Test Sumposium (ETS), 2017 22nd IEEE; May 2017; http://ieeexplore.ieee.org/document/7968233/; DOI: 10.1109/ETS.2017.7968233; 3 pages.

\* cited by examiner

FIG. 9

METHOD AND APPARATUS FOR ADAPTIVE DATA RETENTION MANAGEMENT IN NON-VOLATILE MEMORY

PRIORITY CLAIM

This application claims priority to and the benefit of U.S. provisional patent application No. 62/683,458 filed in the United States Patent Office on Jun. 11, 2018, the entire content of which is incorporated herein by reference as if fully set forth below in its entirety and for all applicable purposes.

FIELD

Aspects of the disclosure relate generally to solid state storage devices, and more specifically, to performing adaptive data retention operations in a solid state drive using non-volatile memory.

INTRODUCTION

In a variety of consumer electronics and computers, solid state drives incorporating non-volatile memories (NVMs) are frequently replacing or supplementing conventional rotating hard disk drives for mass storage. A solid state drive (SSD) or solid state storage may use negative-AND (NAND) flash memory cells for its high density and low cost per cell relative to other generally available non-volatile memory technology. NAND flash or the like utilizes transistor devices to store charge representing data. However, such transistor devices (e.g., flash cells) can lose charge over time, causing data retention issues. Data retention is the capability of retaining information over time. Data retention in solid-state storage devices can depend on various environmental conditions, such as temperature. In general, data retention time of a flash cell decreases at higher temperature. Therefore, solid state storage devices typically implement certain data refreshing operations to refresh stored data before data retention degrades to the extent that data will be corrupted or cannot be correctly read from the storage.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Aspects of the disclosure provide systems and methods for adaptive data retention management in non-volatile memory.

One aspect of the disclosure provides a method of operating a solid state device (SSD) including non-volatile memory (NVM). The method stores data in the NVM and determine a temperature of the NVM. If the temperature of the NVM is below a predetermined temperature, the method maintains a data retention refresh rate of the data stored in the NVM. If the temperature of the NVM is equal to or above the predetermined temperature, the method adjusts the data retention refresh rate at a first rate and then a second rate, each adjustment based on the temperature of the NVM. The first rate and the second rate are different. For example, the second rate is less than the first rate.

Another aspect of the disclosure provides a solid state device (SSD) including a non-volatile memory (NVM). The SSD further includes a sensor configured to determine a temperature of the NVM, and a controller operatively coupled to the NVM and the sensor. The controller is configured to store data in the NVM and determine the temperature of the NVM. If the temperature of the NVM is below a predetermined temperature, the controller is configured to maintain a data retention refresh rate of the NVM. If the temperature of the NVM is equal to or above the predetermined temperature, the controller is configured to adjust the data retention refresh rate at a first rate and then a second rate, each adjustment based on the temperature of the NVM. The first rate and the second rate are different. For example, the second rate may be less than the first rate.

Another aspect of the disclosure provides a solid state device (SSD) including non-volatile memory (NVM). The SSD includes means for storing data in the NVM and means for determining a temperature of the NVM. The SSD further includes means for maintaining a data retention refresh rate of the NVM, when the temperature of the NVM is below a predetermined temperature. The SSD further includes means for, if the temperature of the NVM is equal to or above the predetermined temperature, adjusting the data retention refresh rate at a first rate and then a second rate, each adjustment based on the temperature of the NVM, wherein the first rate and the second rate are different. For example, the second rate may be less than the first rate.

DETAILED DESCRIPTION

Referring now to the drawings, systems and methods for storing data in a solid state storage are illustrated. In the illustrated embodiments, data retention refresh or recycling frequency of a solid state storage may be increased at different rates in different temperature ranges to reduce the internal bandwidth consumed by the data refresh operations.

In some embodiments, a solid state storage can adjust its data retention refresh rate based on its performance requirement or reliability requirement in different temperature ranges.

Figure 1:
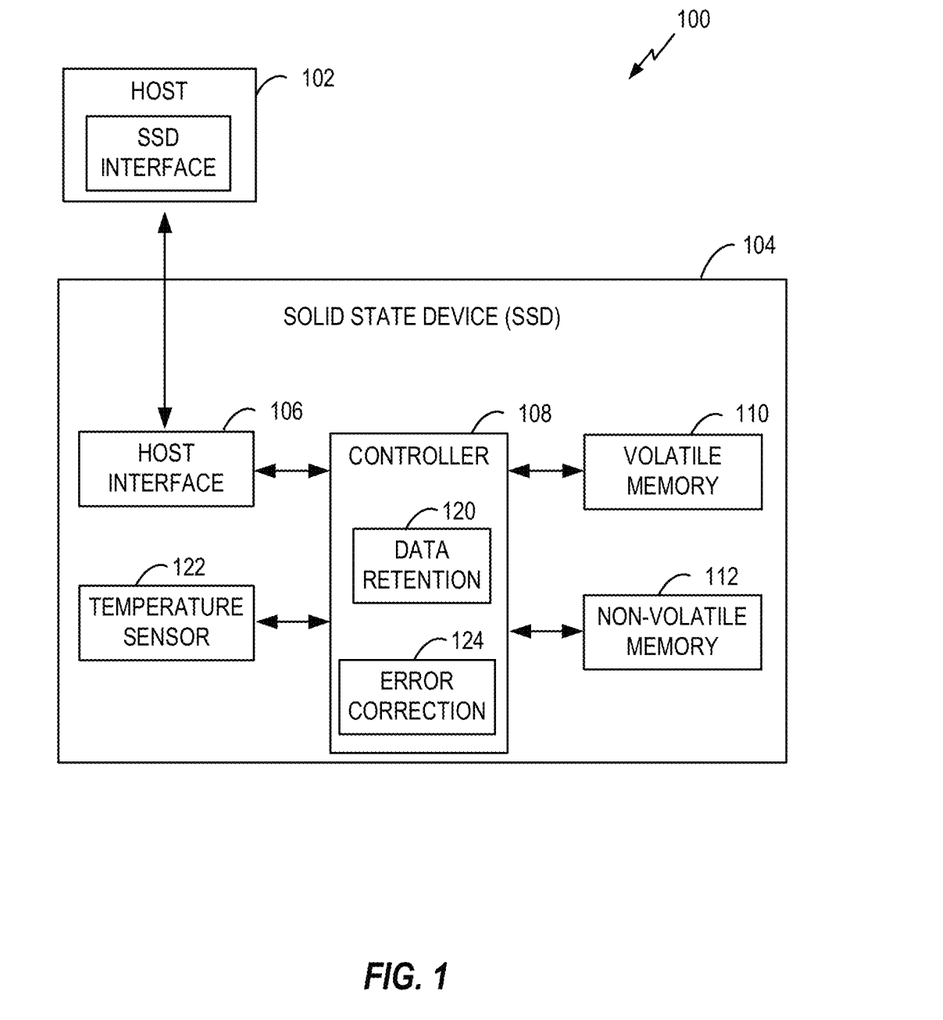
FIG. 1 is a diagram illustrating a computing system that can perform various functions using a non-volatile memory (NVM) in accordance with some embodiments of the disclosure.

FIG. 1 is a block diagram illustrating a computing system that can perform various functions in accordance with some embodiments of the disclosure. The system 100 includes a host 102 and a solid state device (SSD) 104 coupled to the host 102. The host 102 provides various commands via an SSD interface to the SSD 104 for transferring data between the host 102 and the SSD 104. For example, the host 102 may provide a write command to the SSD 104 for writing or programming data to the SSD 104, or a read command to the SSD 104 for reading or retrieving data from the SSD 104. The host 102 may be any system or device having a need for data storage or retrieval and a compatible interface for communicating with the SSD 104. For example, the host 102 may a computing device, a personal computer, a portable computer, a workstation, a server, a personal digital assistant, a digital camera, a digital phone, or the like.

In some embodiments, the SSD 104 includes a host interface 106, a controller 108, a volatile memory 110, and a non-volatile memory (NVM) 112. One example of NVM is flash memory (e.g., NAND flash). The host interface 106 is coupled to the controller 108 and facilitates communication and data transfer between the host 102 and the controller 108. Additionally, the controller 108 is operatively coupled to the volatile memory 110 and the NVM 112. The host interface 106 may be any type of communication interface, such as an Integrated Drive Electronics (IDE) interface, a Universal Serial Bus (USB) interface, a Serial Peripheral (SP) interface, an Advanced Technology Attachment (ATA) interface, a Small Computer System Interface (SCSI), an IEEE 1394 (Firewire) interface, a Peripheral Component Interconnect Express (PCIe) interface, a Common Flash Memory Interface (CFI), a Non-Volatile Memory Express (NVMe) interface, etc. In some embodiments, the host 102 and the SSD 104 may be included in a same unit or system. In other embodiments, the SSD 104 may be remote with respect to the host 102 or may be contained in a remote computing system in data communication with the host 102. For example, the host 102 may communicate with the SSD 104 through a wired and/or wireless communication link. In some examples, the SSD 104 may be included in a network based storage system.

The controller 108 controls various operations of the SSD 104. In various embodiments, the controller 108 receives commands from the host 102 through the host interface 106 and performs the commands to transfer data between the host 102 and the SSD (e.g., NVM 112 and volatile memory 110). The controller 108 may be implemented as any type of processing device, such as a microprocessor, a microcontroller, an embedded controller, a logic circuit, software, firmware, or the like, for controlling the operation of the SSD 104. In one embodiment, the controller 108 can be a special purpose controller specifically configured/programmed to perform any of the functions and algorithm contained and described within the application.

In some embodiments, some or all of the functions, processes, and procedures described herein as being performed by the controller 108 may instead be performed by another element of the SSD 104. The functions of the host interface 106 and the controller 108 may be implemented in the same device. For example, the SSD 104 may include a microprocessor, a microcontroller, an embedded controller, a logic circuit, a field-programmable gate array (FPGA), an application-specific integrated circuit (ASIC), software, firmware, or any kind of processing device, for performing one or more of the functions described herein as being performed by the controller 108 and/or host interface 106. In some embodiments, one or more of the functions described herein as being performed by the controller 108 and/or host interface 106 are instead performed by the host 102. In some embodiments, some or all of the functions described herein as being performed by the controller 108 may instead be performed by another element such as a controller in a hybrid drive including both non-volatile memory elements and magnetic storage elements. In some embodiments, some or all of the functions described herein as being performed by the controller 108 may instead be performed by control circuitry (not shown) included in the NVM 112. In some embodiments, the controller 108, volatile memory 110, and NVM 112 may be included in one or more modules.

The volatile memory 110 may be any memory, computing device, or system capable of storing data. The volatile memory 110 can maintain its data while the device is powered or energized. For example, the volatile memory 110 may be a random-access memory (RAM) such as a dynamic random-access memory (DRAM), a static random-access memory (SRAM), a synchronous dynamic random-access memory (SDRAM), or the like. In various embodiments, the controller 108 uses the volatile memory 110, or a portion thereof, to store data during the transfer of data between the host 102 and the NVM 112. For example, the volatile memory 110 may be a cache memory that may be used to store recently accessed data to improve access speed of the SSD 104 or data to be stored in the NVM 112. In some examples, the volatile memory 110 may be used as a buffer to store immediate data to be stored in the NVM 112. In some embodiments, the SSD 104 may not include the volatile memory 110.

The controller 108 can control writing data to and reading data from the NVM 112. In some embodiments, the NVM 112 may include one or more types of non-volatile data storages, such as a flash storage system (e.g., NAND based storage system), a solid state drive, a flash memory card, a secure digital (SD) card, a universal serial bus (USB) memory device, a CompactFlash card, a SmartMedia device, a flash storage array, a flash storage, an erasable programmable read-only-memory (EPROM), an electrically erasable programmable read-only-memory (EEPROM), magnetoresistive random-access memory, non-volatile RAM, ferroelectric RAM, or phase-change RAM, or the like.

In some embodiments, the controller 108 may include a data retention block 120 configured to perform various data retention functions and algorithm described in this disclosure, for example, FIGS. 5-9. For example, the data retention block 120 may include hardware and/or software that are configured to perform data retention operations on the NVM 112 based on various factors including cell temperature, time lapse since last data programmed time, and/or current life of cells. The life of a flash cell may be based on program/read (P/E) cycling. A flash cell has a specified P/E cycling limit. The time period in which a flash cell can reliably retain data decreases as the cell goes through more P/E cycles. When the number of P/E cycles exceeds the specified limit, the cell may be considered worn out and can no longer retain data reliability. Data retention time also decreases at higher temperature. The controller 108 may use one or more temperature sensors (one exemplary sensor 122 illustrated in FIG. 1) to measure the temperature of the SSD 104 or NVM 112.

Figure 2:
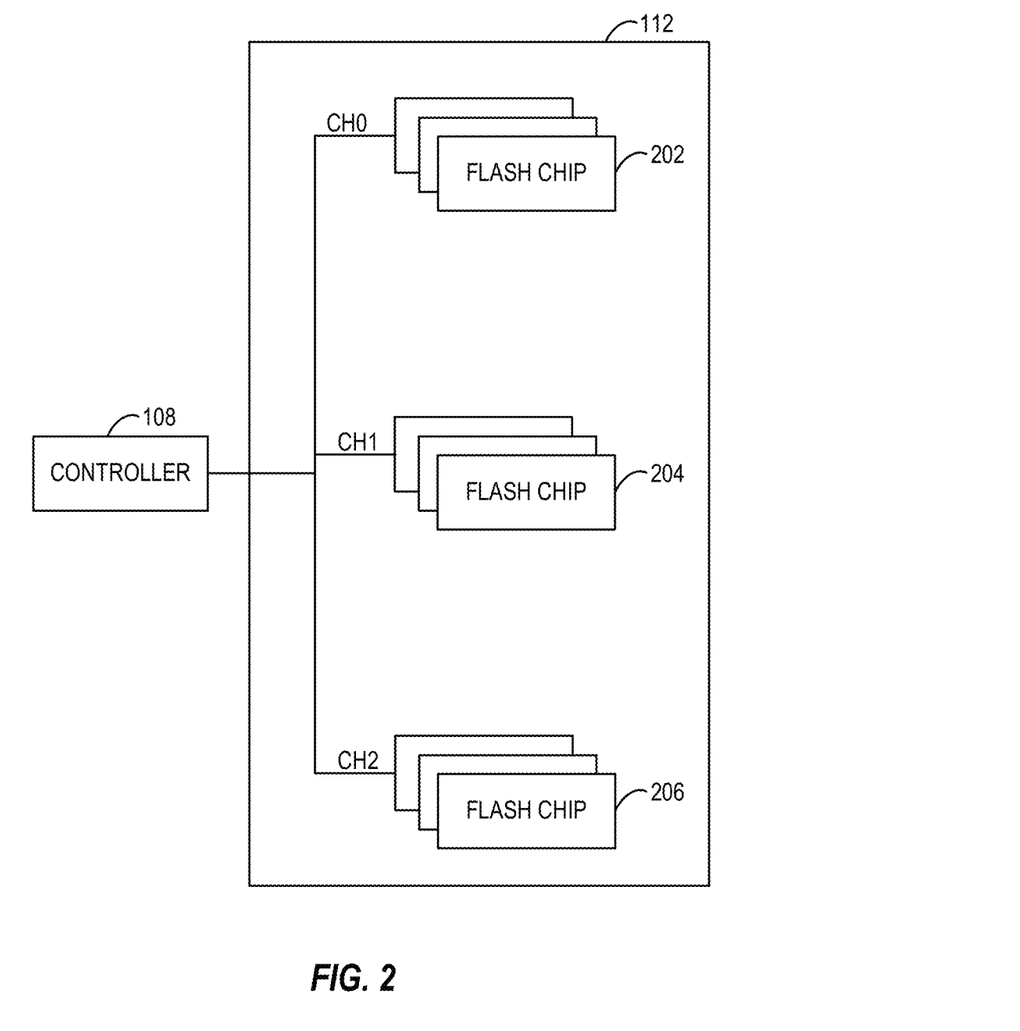
FIG. 2 is a block diagram illustrating the NVM of FIG. 1 in more detail in accordance with some embodiments of the disclosure.

FIG. 2 is a block diagram illustrating the NVM 112 in more detail in accordance with some embodiments of the disclosure. The NVM 112 may include flash chips arranged in multiple channels with each channel including one or more flash chips or flash packages. Each flash chip may include one or more flash dies each providing a plurality of memory cells (flash cells) for storing data. Three exemplary data channels CH0, CH1, CH2 are shown in FIG. 2. For example, a first channel CH0 can access a first group of flash chips 202, a second channel CH1 can access a second group of flash chips 204, and a third channel CH2 can access a third group of flash chips 206. The unit for reading and writing of a flash based storage (e.g., NAND flash) is a page that includes multiple flash cells. A number of pages are grouped into a block. In some embodiments, a unit for erasing data stored in a NAND flash is a block that includes a number of pages. A number of blocks are grouped into a plane. A logic unit (LUN) includes a plurality of planes. A flash based storage may include multiple LUNs. The controller 108 can issue commands to read or write a page of a plane independently of other planes. The controller 108 also can issue commands to erase a certain block of a plane in a LUN.

In general, writing data to a NAND flash is much slower than reading data from the flash. One reason of unpredictability in read latency of a flash based storage is due to write-read collisions at the flash chip. This problem of read-write collisions gets worse in higher bit density per cell flash storage. For example, when the controller 108 schedules a write command that is followed by a read command to access the flash chips 202 on the first channel (CH0), the read command may be blocked by the write command, causing read latency.

Figure 3:
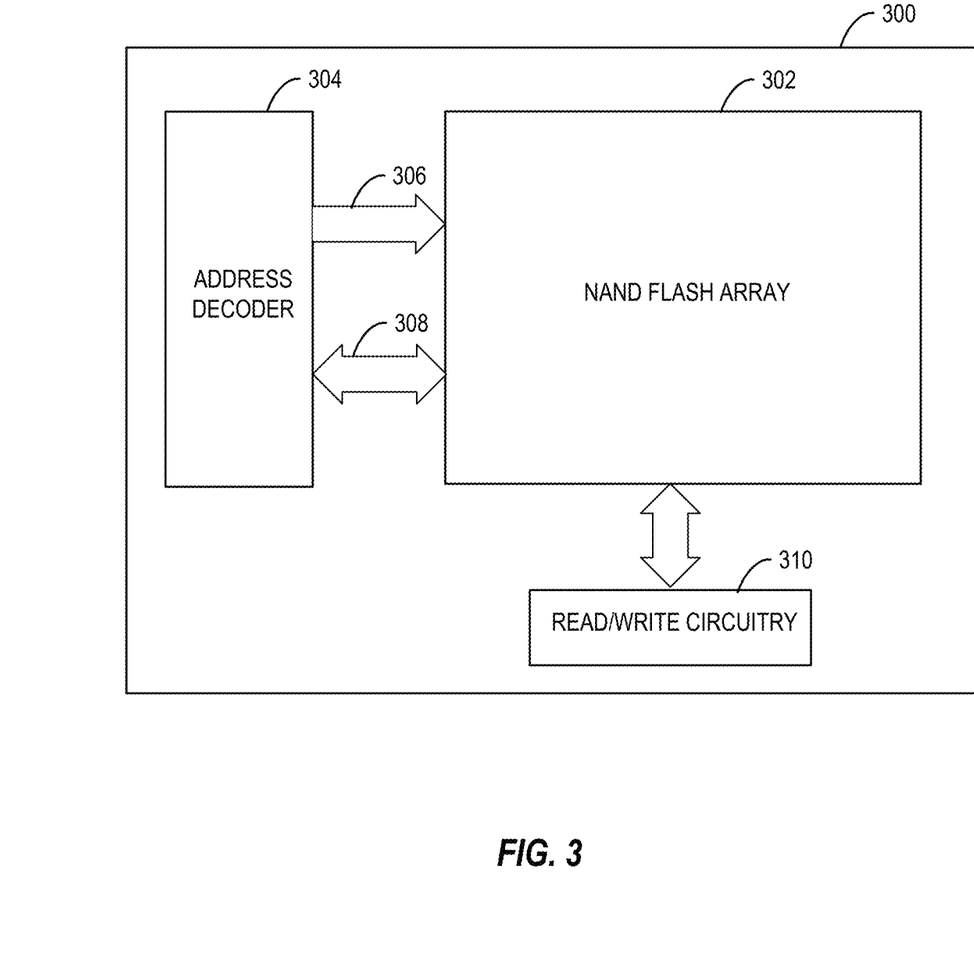
FIG. 3 is a conceptual block diagram of a NVM in accordance with one embodiment of the disclosure.

FIG. 3 is a conceptual block diagram of an exemplary flash based storage 300 including NAND flash memory in accordance with some embodiments of the disclosure. In some examples, the NVM 112 may be implemented using one or more flash based storage 300. In one embodiment, the flash based storage 300 includes a NAND flash memory array 302 that includes a plurality of flash memory cells or devices. The flash based storage 300 may include an address decoder 304 for addressing the NAND flash memory array 302 by selecting one or more wordlines and bit lines 306 connected to the desired cells. Therefore, data 308 may be written to or read from the memory array 302. The flash based storage 300 may include a read-write circuitry 310 that is configured to generate various signals (e.g., voltages and/or currents) for writing, programming, reading, erasing, and/or refreshing the memory cells of the NAND flash array 302. In some embodiments, the controller 108 may issue various commands to control the address decoder 304 and read/write circuitry 310. The read-write circuitry 310 may also be configured to sense, detect, and determine the voltage and/or current of each cell of the array 302 to program data to and read data from the cells. Each memory cell may be programmed to a certain program state among a number of program states or levels. Each state corresponds to a specific binary value or bit value. For example, a cell can store an integer number B of bits when it is capable of being programmed to one of $2^B$ discrete program states or levels.

The read-write circuitry 310 may store data received from the host 102 or controller 108 in one or more predetermined pages each including multiple memory cells. When the host reads data (e.g., a file) from the NVM 112, the controller 108 and/or the read-write circuitry 310 can determine the page that stores the requested data, and the read-write circuitry 310 can generate the correct signals (e.g., read threshold voltage(s)) to read the data from that page. In some embodiments, the read-write circuitry 310 or its functions may be included in the controller 108. The read-write circuitry 310 may include buffers for storing data to be programmed to or read from the flash array. In some examples, the buffers may be SRAM or the like.

In some embodiments, the NAND flash array 302 may be implemented using multi-level cells (e.g., 2 bits/cell, 3 bits/cell or 4 bits/cell). To increase write (program) throughput, the controller can stripe the write request among flash chips across different channels. For example, the controller can first stripe data across channels (e.g., CH0, CH1, CH2 of FIG. 2), then the controller can stripe data across flash chips and/or dies (e.g., flash chips 202, 204, 206 of FIG. 2). Then, the controller can further stripe data across flash planes in a LUN. In general, reading a flash memory cell involves measuring the flow of electricity through the cell. One or more reference or read voltages are applied across the cell (e.g., source and drain electrodes) and the current across the cell is measured.

Each binary value corresponds to a specific threshold voltage. For example, the lowest binary value may correspond to the highest voltage, the highest binary value may correspond to the lowest voltage, and intermediate binary values correspond to progressively different threshold voltages between the highest and lowest voltages. The correct threshold voltage of a cell for the stored binary value is set in a program process. To read a flash cell, different read voltages are applied successively, with a different read voltage being applied each time. Therefore, the more states a cell has, the more threshold voltage tests need be performed to read the stored data.

In general, the SSD 104 has a specification including performance requirement and reliability requirement during normal operation. Performance requirement or specification indicates how quickly data can be read from the SSD below certain bit error rate (BER) or how fast data can be read within certain time without any read retry. Reliability requirement or specification indicates how much data can be read from the SSD below certain BER or how much data can be read successfully within certain time while allowing read retries. Depending on the applications, the performance or reliability specification may be more important than the other requirement.

Various factors can affect data retention time in the SSD 104 such as, for example, time and temperature. In particular, these factors may include (1) how long data has been programmed, (2) under what temperature, and (3) current cell condition. Higher temperature can adversely affect data retention in the SSD 104. It is because higher temperature may reduce data retention time. Therefore, the SSD implements a data refresh operation before the stored data degrades to the extent that can no longer be read correctly or reliably from the SSD. The frequency of data refresh operations is called the data retention refresh rate in this specification. In general, a data refresh operation includes reading data from the NVM 112 and rewriting/programming the data back to the same cells or different cells.

Figure 4:
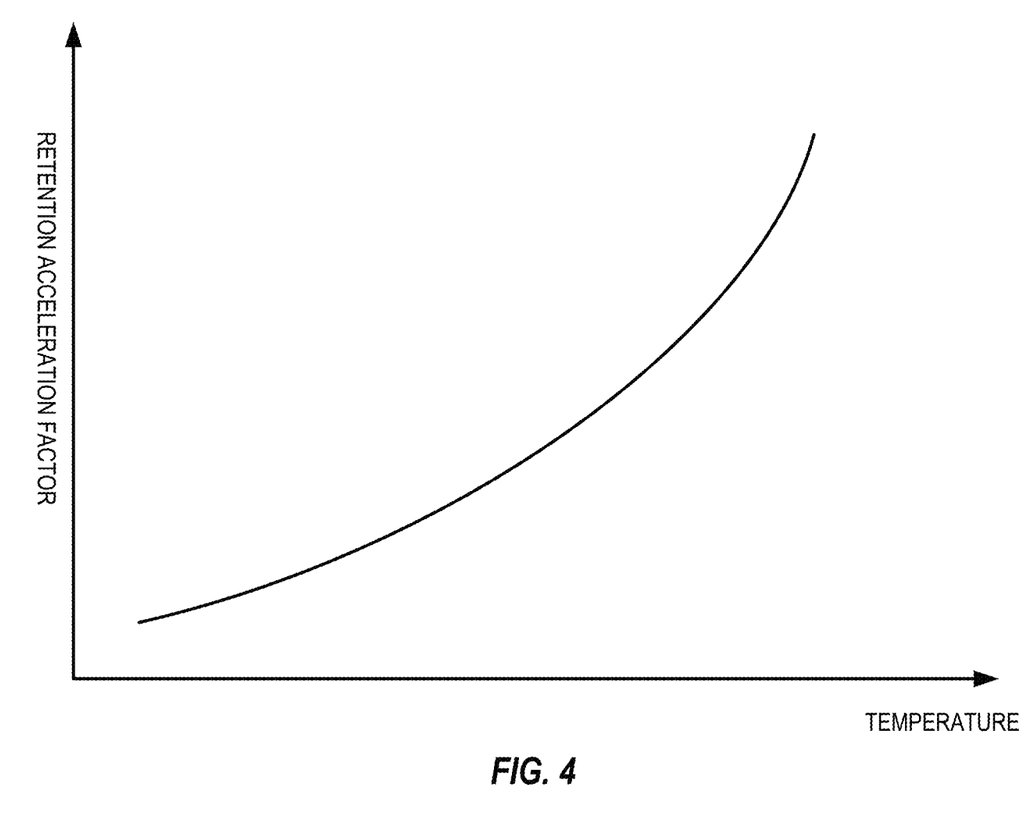
FIG. 4 is a graph conceptually illustrating a relationship between a data retention acceleration factor and temperature in accordance with one embodiment.

FIG. 4 is a graph conceptually illustrating a relationship between a data retention acceleration factor and temperature according to one embodiment. The horizontal axis represents temperature, and the vertical axis represents the data retention acceleration factor. The higher the data retention acceleration factor, the faster data stored in NVM degrades over a certain period of time. FIG. 4 shows that as temperature increases, the data retention acceleration factor also increases in a substantially exponential manner. In other words, data retention time of the NVM degrades faster when temperature increases. The curve of FIG. 4 is merely one illustrative example. In other examples, data retention acceleration factor and temperature may have another relationship.

Figure 5:
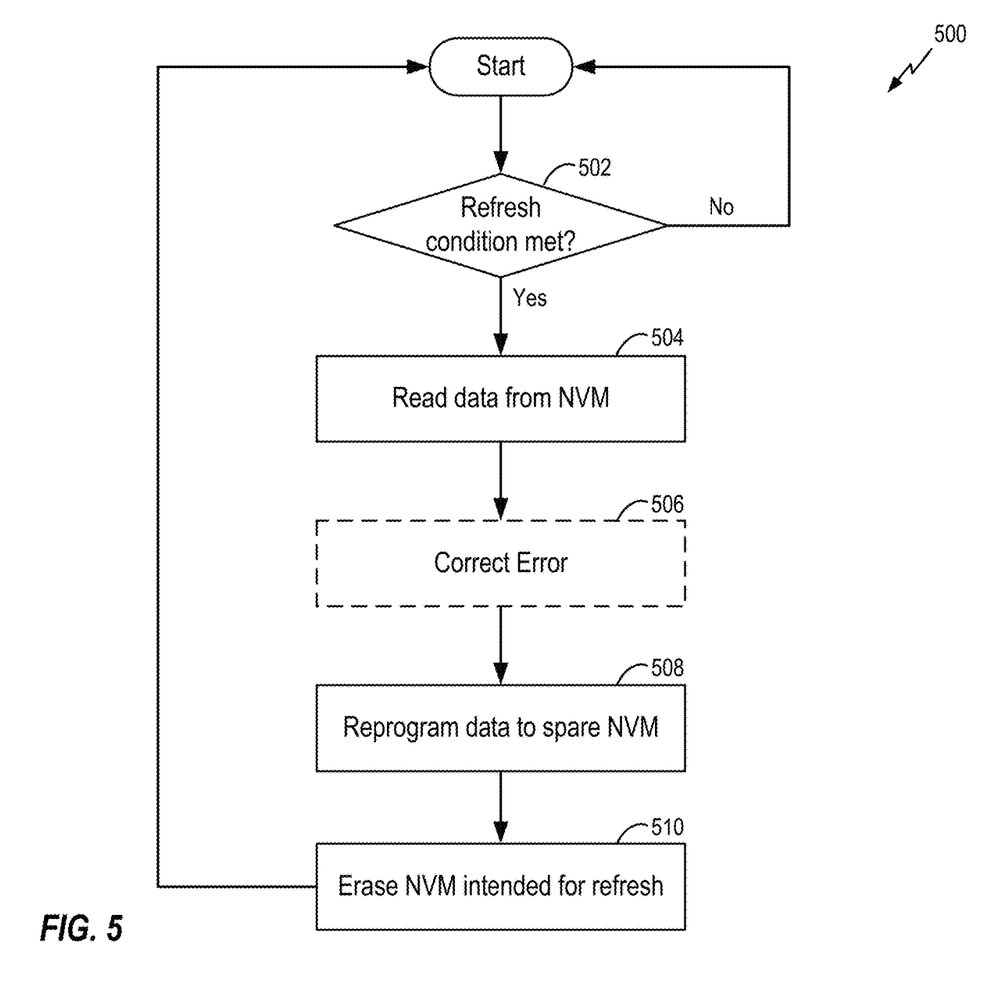
FIG. 5 is a flow chart illustrating a data refresh process in accordance with one embodiment.

FIG. 5 is a flow chart illustrating a data refresh process 500 for SSD according to an embodiment. In some examples, the data refresh process 500 may be performed by the SSD controller 108 to refresh data stored at the NVM 112. In other examples, the data refresh process 500 may be performed by any memory controller to refresh data stored in a memory.

At decision block 502, the SSD controller 108 determines whether a data retention refresh condition is met. For example, the SSD controller 108 may use the data retention block 120 to determine current data retention time. The current data retention time indicates how long data has been stored at the NVM 112 or its memory cells since the last refresh operation. In some examples, the controller may use a timer to keep track of the time lapse since the last data refresh operation. In some examples, the controller may record the time of the last refresh operation, and compare it with the current system time to determine the current data retention time.

If the data refresh condition is met (yes branch of block 502), at the block 504, the SSD controller reads data from the NVM 112. For example, the controller may use the address decoder 304 and read/write circuitry 301 to read data from the flash cells of the NVM. The controller may read data from the NVM 112 in page unit. At block 506, the SSD controller may optionally perform error correction on the data. For example, the SSD controller may use an error correction block 124 to detect and correct any error found in the data that is protected by an error correction code (ECC). At block 508, the controller reprograms or writes the data back to spare locations on the NVM 112. In some examples, the SSD controller may reprogram the data back to the same locations or cells. In other examples, the SSD controller may reprogram the data to different locations or cells, for example, to balance the P/E cycles of the cells or replace worn out cells. At block 510, the controller erases the data at the location refreshed.

In one embodiment, the SSD controller 108 may adjust the data retention refresh rate based on temperature. As described above, data retention time generally decreases at higher temperature. Therefore, the SSD controller 108 may increase data retention refresh rate (i.e., reduce time between data refreshes) as temperature increases. In some examples, the SSD controller 108 may follow a linear Arrhenius table or the like to increase data retention refresh rate when temperature increases. However, the reading and reprogramming of data from and to the NVM generate internal data traffic that may reduce the performance of the SSD from the host's perspective. This is because during data retention refresh, the background processes for moving data among the SSD controller 108 and the NVM 112 reduce the effective data bandwidth of the SSD available to the host 102.

Figure 6:
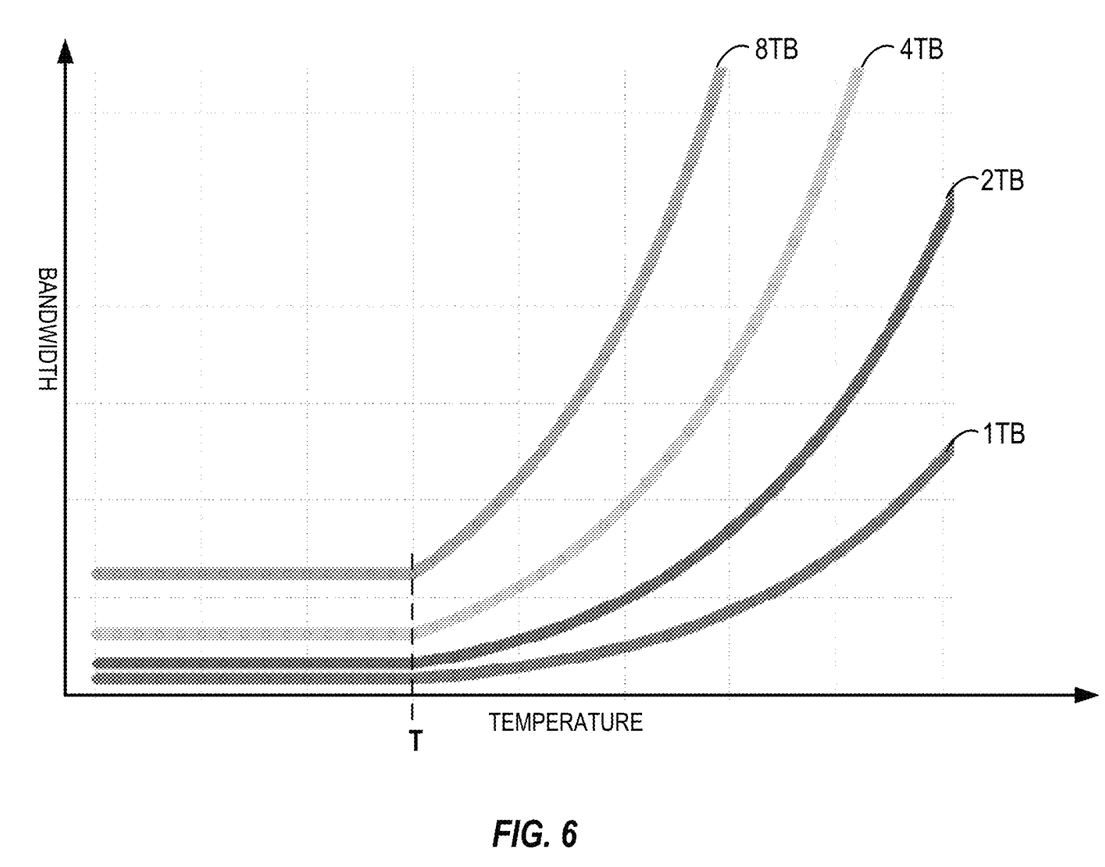
FIG. 6 is a diagram conceptually illustrating internal bandwidth consumed by data refresh operations in various storage devices with different capacities.

FIG. 6 is a diagram conceptually illustrating bandwidth consumption by data retention refresh operations in various storage devices with different capacities. In particular, FIG. 6 shows the data refresh traffic generated by 1 TB, 2 TB, 4 TB, and 8 TB devices. Below a certain temperature T, the data refresh traffic remains substantially constant for all drives because the data retention refresh rate is not increased with respect to rising temperature. When the temperature is higher than T, however, the controllers of these devices may increase their respective data retention refresh rates with respect to temperature. The larger the device capacity, the more bandwidth is consumed by data refresh operations because more data are read and reprogrammed in larger capacity devices. Therefore, it will be desirable to reduce or minimize the bandwidth used by data retention refreshes, especially for larger capacity devices.

In some embodiments, an SSD controller can monitor the temperature of the NVM using onboard and/or external temperature sensors (e.g., temperature sensor 122). In some examples, below a predetermined temperature (e.g., temperature T of FIG. 6), the SSD is in a temperature region that is performance critical. It means that the SSD reads data from the NVM (e.g., NAND array) within certain time limit without any read retry to meet the performance specification. To that end, the SSD may not increase data retention refresh rate even when temperature increases. Any error in the read data may be handled using an error correction algorithm and/or encoding. Above the predetermined temperature, the SSD is in a temperature region that is reliability critical. It means that the SSD reads data from the NVM below a certain bit error rate (BER), if needed, using read retries. In some examples, the SSD controller may use a linear Arrhenius table or the like to increase data retention refresh rate when temperature increases. However, if data retention refresh rate is increased too aggressively, data integrity may be guaranteed at the expense performance loss. It is because frequent data retention refreshes generate a large amount of background traffic that reduces the available bandwidth for the host to access the SSD.

Figure 7:
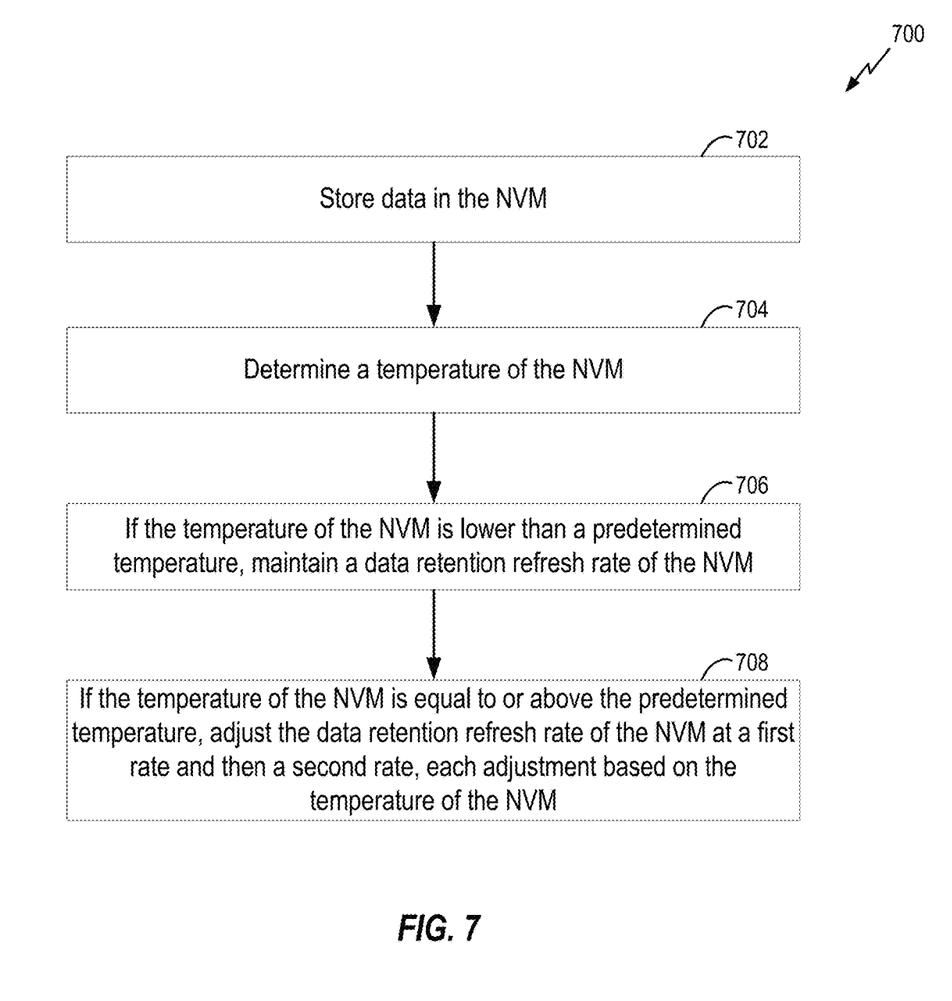
FIG. 7 is a flow chart illustrating an adaptive data retention management procedure in accordance with some embodiments.

FIG. 7 is a flow chart illustrating an adaptive data retention management procedure 700 according to some embodiments. The adaptive data retention management procedure 700 may be implemented at the SSD 104 described above in relation to FIGS. 1-3 or any data storage devices. For example, the procedure 700 may be executed by the SSD controller 108 and/or a processor embedded within the NVM 112. In some embodiments, the procedure 700 may be performed by any data storage device to manage data retention.

At block 702, the SSD controller 108 store data in the NVM 112. For example, the SSD controller 108 may receive the data from the host 102 via the host interface 106. In other examples, the data may be retrieved from the volatile memory 110. The SSD controller 108 may program the data to the NAND flash array 302 (see FIG. 3) using the address decoder 304 and read/write circuitry 310. For example, the controller 108 may program data to the NVM 112 using a number of program loops. In each program loop, the controller 108 may increase the threshold voltage of a flash cell by a certain amount to achieve the desired cell threshold voltage for storing the corresponding data value.

At block 704, the SSD controller 108 determines a temperature of the NVM or SSD. For example, the controller 108 may use the temperature sensor 122 to determine the temperature. Some non-limiting examples of temperature sensors are thermostat, thermistor, resistive temperature detector, thermocouple, solid state temperature sensor, etc. In some embodiments, the SSD 104 may have one or more temperature sensors that may be internal and/or external to the NVM 112. When the controller 108 uses a plurality of temperature sensors, the controller 108 may use any suitable methods to combine the readings of the temperature sensors to arrive at the temperature of the NVM or SSD. In some embodiments, the controller 108 may use the highest temperature, lowest temperature, an average of the temperatures, a mean of the temperatures, etc.

As described above, data retention time of the NVM depends on the temperature of the NVM. In general, data retention time decreases as temperature increases. In some embodiments, the SSD controller 108 adaptively adjusts a data retention refresh rate of the NVM 112 based on temperature. For example, the SSD controller 108 changes or shifts its pace of changing the data retention refresh rate. At block 706, if the temperature of the NVM is lower than a predetermined temperature, the SSD controller 108 maintains the data retention refresh rate of the NVM. In one example, the data retention refresh rate remains unchanged. In one example, the predetermined temperature may be 55° C. or any suitable value.

At block 708, if the temperature of the NVM is equal to or above the predetermined temperature, the SSD controller 108 may adjust the data retention refresh rate of the NVM at a first rate and then a second rate, each adjustment based on the temperature of the NVM. The first rate and the second rate are different. In one example, the first rate may be higher than the second rate. In another example, the second rate may be zero. In some examples, the SSD controller 108 may increase the data retention refresh rate according to a non-linear relationship between the temperature the of the NVM and data retention refresh time. For example, the SSD controller 108 may use the data retention block 120 to control the data retention refresh rate and refresh the data in the NVM using the data refresh process 500 described in relation to FIG. 5.

Figure 8:
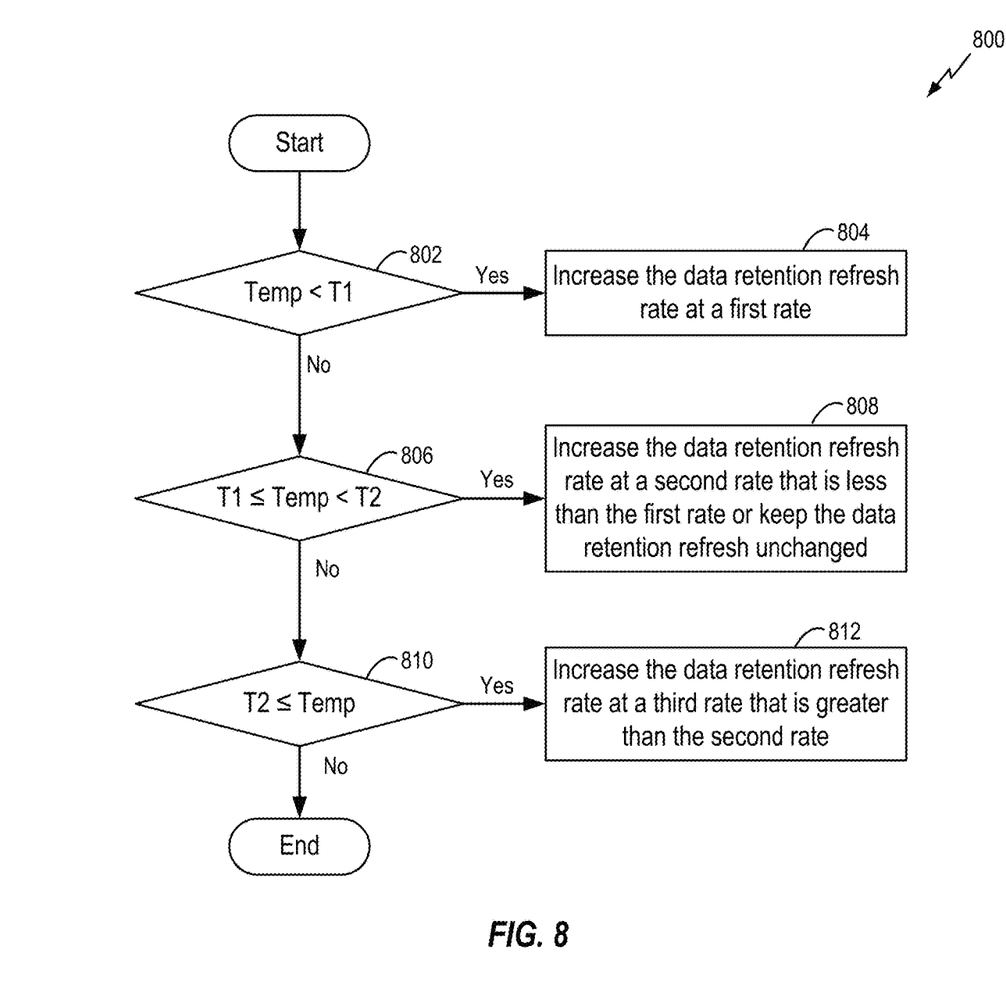
FIG. 8 is a flow chart illustrating a data retention refresh rate adjustment procedure in accordance with some embodiments.

FIG. 8 is a flow chart illustrating a data retention refresh rate adjustment procedure 800 according to some embodiments. The data retention refresh rate adjustment procedure 800 may be implemented at the SSD 104 described above in relation to FIGS. 1-3 or any data storage devices. For example, the procedure 800 may be executed by the SSD controller 108 at block 708 of FIG. 7 when the temperature of NVM is greater than a predetermined temperature T'.

Figure 9:
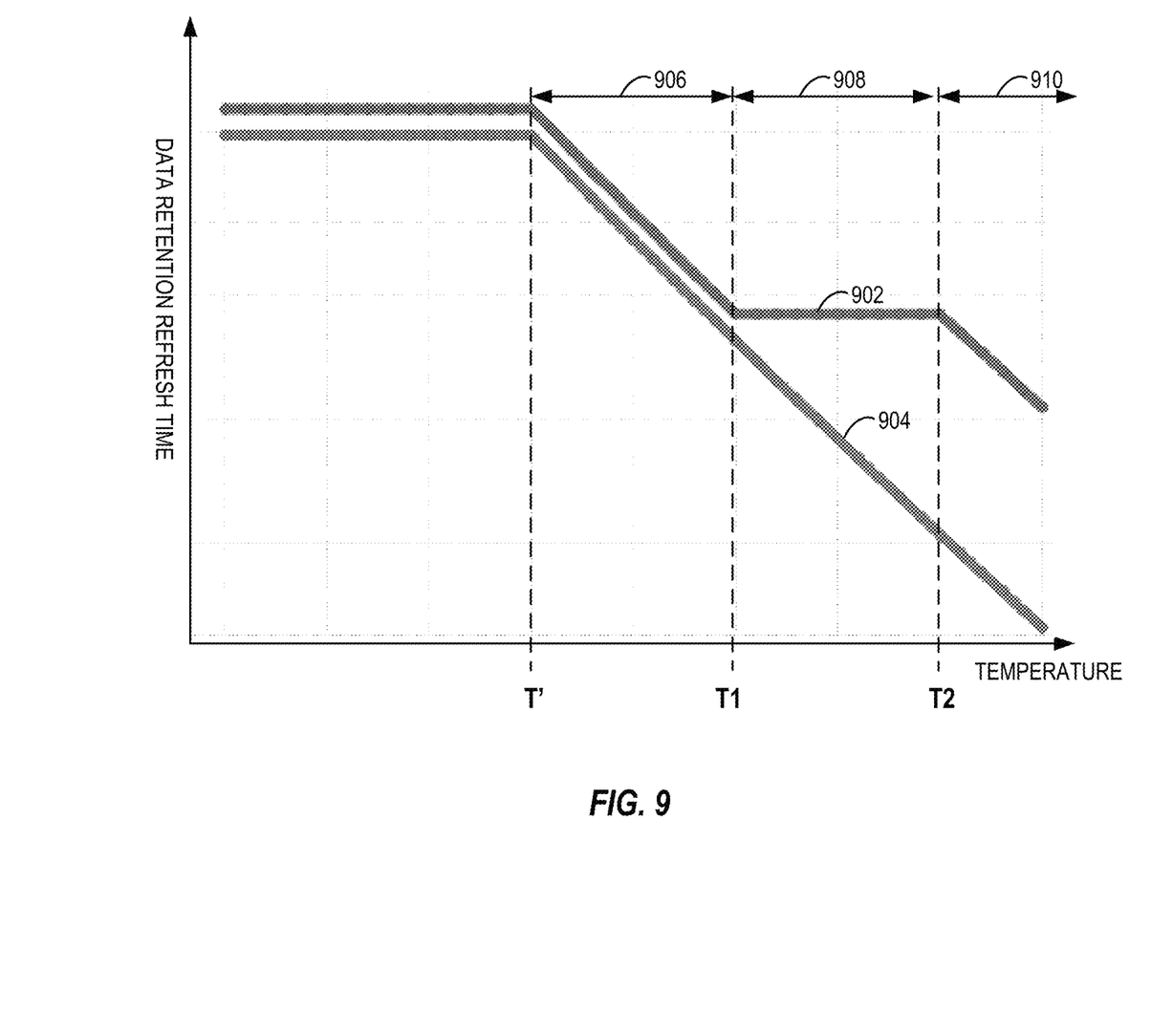
FIG. 9 is a diagram illustrating two data retention refresh rate curves.

FIG. 9 is a diagram illustrating two data retention refresh rate curves according to one embodiment. A first curve 902 represents the change of the data retention refresh rate of the NVM 112 using the data retention refresh rate adjustment procedure 800 described below in relation to FIG. 8. A second curve 904 represents the change of the data retention refresh rate of using another adjustment procedure for comparison.

At decision block 802, the SSD controller 108 determines whether the temperature of the NVM 112 is lower than a first temperature T1 or not. In this case, the first temperature T1 is higher than the predetermined temperature T' described in blocks 706 and 708 in FIG. 7. If the temperature of the NVM is lower than the first temperature T1 (yes branch of decision block 802), the SSD controller 108 may increase the data retention refresh rate of the NVM at a first rate in a temperature range between T' and T1. For example, referring to curve 902 of FIG. 9, the data retention refresh rate of the NVM is increased in a linear fashion with respect to raising temperature in the temperature range 906 between T' and T1. In FIG. 9, the vertical axis represents data retention refresh time, which is the inverse of the data retention refresh rate. Therefore, when the curve 902 goes down, the corresponding data retention refresh rate goes up. Increasing the data retention refresh rate shortens the time between successive data refreshes. In this example, the first rate of increasing the data retention refresh rate may be greater than zero, and the SSD controller 108 may progressively reduce the data retention refresh time of the NVM according to a linear Arrhenius table that may be specifically selected for the SSD 104. The second curve 904 follows a similar pattern in the temperature range 906.

If the temperature of the NVM is not lower (e.g., is higher) than the first temperature T1 (i.e., no branch of block 802), the procedure proceeds to decision block 806. At decision block 806, the SSD controller 108 determines whether the temperature of the NVM 112 is between the first temperature T1 and a second temperature T2 (e.g., temperature range 908 of FIG. 9). If the temperature of the NVM is between T1 and T2, at block 808, the SSD controller 108 increases the data retention refresh rate at a second rate that is less than the first rate, or keeps the data retention refresh rate unchanged. In one embodiment, the SSD controller 108 may maintain or substantially maintain the data retention refresh rate unchanged in this temperature range 908 (see FIG. 9). In contrast, the data retention refresh rate of the curve 904 continues to increase (i.e., shorter time between data refreshes). In other examples, whether the date retention refresh rate is increased/maintained or not in a certain temperature range may be based on the desired performance or retry rate in that temperature range.

If the temperature of the NVM is not between T1 and T2 (no branch of decision block 806), the procedure proceeds to decision block 810. At decision block 810, the SSD controller 108 determines whether the temperature of the NVM 112 is higher than the second temperature T2 or not. In this case, the second temperature T2 is higher than T1 (see FIG. 9). If the temperature of the NVM is higher than T2 (yes branch of decision block 810), at block 812, the SSD controller 108 may increase the data retention refresh rate of the NVM at a third rate that is greater than the second rate described in block 804 in a temperature range 910 (see FIG. 9) higher than T2. In some embodiments, the first rate of block 804 and the third rate of block 812 may be the same. That means the data retention refresh rate is increased at the same rate. In some embodiments, the first rate and the third rate of increasing the data retention refresh rate may be different, but both rates are higher than the second rate of block 808.

Referring to FIG. 9, using the procedure 800 described above, the overall rate of increasing the data retention refresh rate of curve 902 is lower than that of curve 904 for comparison. Therefore, the internal data bandwidth of the SSD 104 consumed by data retention refresh operations may be reduced. As a result, the SSD 104 may provide a higher level of performance to the host 102 over a larger temperature range as compared to the related art. In the temperature range 908 (between T1 and T2), although the SSD controller 104 does not increase the data retention refresh rate in response to rising temperature, data integrity may be protected using read retry as defined in the reliability specification of the SSD.

In some examples, the predetermined temperature T' may be about 55° C., T1 may be about 65° C., T2 may be about 75° C. However, these temperatures are illustrative in nature only. In other embodiments, the SSD controller may use other temperatures when performing the above-described procedures to adjust data retention refresh rate to minimize the increase of data bandwidth consumed by data refreshes. In some embodiments, the SSD controller may adjust (e.g., increase) the data retention refresh rate according to an Arrhenius curve that is specific to the SSD 104 or NVM 112. In some embodiments, the SSD controller may adjust the data retention refresh rate to meet a performance specification of the SSD, for example, in the temperature range between T' and T1; and the SSD controller may adjust the data retention refresh rate to meet a reliability specification of the SSD, for example, in the temperature range higher than T2.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner Tasks or events may be added to or removed from the disclosed example embodiments. The example systems and components described herein may be configured differently than described. For example, elements may be added to, removed from, or rearranged compared to the disclosed example embodiments.

What is claimed is:

1. A method of operating a solid state device (SSD) comprising non-volatile memory (NVM), the method comprising:
    storing data in the NVM;
    determining a temperature of the NVM;
    if the temperature of the NVM is less than a predetermined temperature, maintaining a data retention refresh rate of the data stored in the NVM; and
    if the temperature of the NVM is equal to or greater than the predetermined temperature, adjusting the data retention refresh rate such that:
        when the temperature of the NVM is equal to or greater than the predetermined temperature and in a first temperature range from T0 to T1, increasing the data retention refresh rate at a first rate;
        when the temperature of the NVM is equal to or greater than the predetermined temperature and in a second temperature range from T1 to T2, maintaining the data retention refresh rate over a temperature range greater than 4 degrees and within the second temperature range; and
        when the temperature of the NVM is equal to or greater than the predetermined temperature and in a third temperature range from T2 to T3, increasing the data retention refresh rate of the NVM at a third rate, wherein T0<T1<T2<T3.

2. The method of claim 1, wherein the adjusting the data retention refresh rate comprises:
    increasing the data retention refresh rate of the NVM at a second rate that is less than the first rate, over a temperature range in the second temperature range.

3. The method of claim 2, wherein the third rate greater than the second rate.

4. The method of claim 3, wherein the first rate is substantially equal to the third rate.

5. The method of claim 3, wherein the data retention refresh rate of the NVM in the first temperature range is less than the data retention refresh rate of the NVM in the second temperature range.

6. The method of claim 5, wherein the data retention refresh rate of the NVM in the second temperature range is less than the data retention refresh rate of the NVM in the third temperature range.

7. The method of claim 3,
    wherein the increasing the data retention refresh rate of the NVM at the first rate, comprises increasing the data retention refresh rate according to an Arrhenius curve; and
    wherein the increasing the data retention refresh rate of the NVM at the third rate, comprises increasing the data retention refresh rate according to the Arrhenius curve.

8. The method of claim 3,
    wherein the increasing the data retention refresh rate of the NVM at the first rate, comprises increasing the data retention refresh rate at the first rate to meet a performance specification of the SSD, and
    wherein the increasing the data retention refresh rate of the NVM at the third rate, comprises increasing the data retention refresh rate at the third rate that is different from the first rate to meet a reliability specification of the SSD.

9. A solid state device (SSD) comprising:
    a non-volatile memory (NVM);
    a sensor configured to determine a temperature of the NVM; and
    a controller operatively coupled to the NVM and the sensor;
    wherein the controller is configured to:
    store data in the NVM;
    determine the temperature of the NVM;
    if the temperature of the NVM is less than a predetermined temperature, maintain a data retention refresh rate of the NVM; and
    if the temperature of the NVM is equal to or greater than the predetermined temperature, adjust the data retention refresh rate such that:
        when the temperature of the NVM is equal to or greater than the predetermined temperature and in a first temperature range from T0 to T1, increasing the data retention refresh rate at a first rate;
        when the temperature of the NVM is equal to or greater than the predetermined temperature and in a second temperature range from T1 to T2, maintaining the data retention refresh rate over a temperature range greater than 4 degrees and within the second temperature range; and
        when the temperature of the NVM is equal to or greater than the predetermined temperature and in a third temperature range from T2 to T3, increasing the data retention refresh rate of the NVM at a third rate, wherein T0<T1<T2<T3.

10. The SSD of claim 9, wherein the controller is further configured to:
    increase the data retention refresh rate at a second rate that is less than the first rate, over a temperature range in the second temperature range.

11. The SSD of claim 10, wherein
    the third rate is greater than the second rate.

12. The SSD of claim 11, wherein the first rate is substantially equal to the third rate.

13. The SSD of claim 11, wherein the controller is further configured to:

in the first temperature range, increase the data retention refresh rate according to an Arrhenius curve to meet a performance specification of the SSD.

14. The SSD of claim 13, wherein the controller is further configured to:
in the third temperature range, increase the data retention refresh rate according to the Arrhenius curve to meet a reliability specification of the SSD.

15. The SSD of claim 9, wherein the controller is further configured to:
increase the data retention refresh rate when the temperature is equal to or above the predetermined temperature and lower than a first temperature;
maintain the data retention refresh rate when the temperature is equal to or above the first temperature and lower than a second temperature; and
increase the data retention refresh rate when the temperature is equal to or above the second temperature.

16. A solid state device (SSD) comprising non-volatile memory (NVM) comprising:
means for storing data in the NVM;
means for determining a temperature of the NVM;
means for maintaining a data retention refresh rate of the NVM, when the temperature of the NVM is less than a predetermined temperature; and
means for, if the temperature of the NVM is equal to or greater than the predetermined temperature, adjusting the data retention refresh rate such that:
when the temperature of the NVM is equal to or greater than the predetermined temperature and in a first temperature range from T0 to T1, increasing the data retention refresh rate at a first rate;
when the temperature of the NVM is equal to or greater than the predetermined temperature and in a second temperature range from T1 to T2, maintaining the data retention refresh rate over a temperature range greater than 4 degrees and within the second temperature range; and
when the temperature of the NVM is equal to or greater than the predetermined temperature and in a third temperature range from T2 to T3, increasing the data retention refresh rate of the NVM at a third rate,
wherein T0<T1<T2<T3.

17. The SSD of claim 16, wherein the means for adjusting the data retention refresh rate is configured to:
increase the data retention refresh rate of the NVM at a second rate that is less than the first rate, over a temperature range in the second temperature range.

18. The SSD of claim 17, wherein
the third rate that is greater than the second rate, and
wherein the data retention refresh rate of the NVM in the first temperature range is less than the data retention refresh rate of the NVM in the second temperature range that is less than the data retention refresh rate of the NVM in the third temperature range.

19. The SSD of claim 18, wherein the first rate is substantially equal to the third rate.

20. The SSD of claim 18, the means for adjusting the data retention refresh rate is configured to:
increase the data retention refresh rate of the NVM at the first rate according to an Arrhenius curve; and
increase the data retention refresh rate of the NVM at the third rate according to the Arrhenius curve.

21. The SSD of claim 18, the means for adjusting the data retention refresh rate is configured to:
in the first temperature range, increase the data retention refresh rate at the first rate to meet a performance specification of the SSD, and
in the third temperature range, increase the data retention refresh rate at the third rate that is different from the first rate to meet a reliability specification of the SSD.

22. The SSD of claim 16, wherein the means for adjusting the data retention refresh rate is configured to increase the data retention refresh rate according to a non-linear relationship between the temperature the of the NVM and data retention refresh time.

23. The apparatus of claim 9, wherein the controller is further configured to:
in the first temperature range, increase the data retention refresh rate at the first rate to meet a performance specification of the SSD, and
in the third temperature range, increase the data retention refresh rate at the third rate that is different from the first rate to meet a reliability specification of the SSD.

* * * * *